(12) United States Patent  (10) Patent No.: US 7,353,706 B2
McAlexander, III  (45) Date of Patent: Apr. 8, 2008

(54) WEIGHTED RELEASED-BEAM SENSOR

(75) Inventor: Joseph Colby McAlexander, III, Murphy, TX (US)

(73) Assignee: STMicroelectronics, Inc., Carrollton, TX (US)

(*) Notice: Subject to any disclaimer, the term of this patent is extended or adjusted under 35 U.S.C. 154(b) by 158 days.

(21) Appl. No.: 11/024,191

(22) Filed: Dec. 28, 2004

(65) Prior Publication Data

US 2006/0137449 A1  Jun. 29, 2006

(51) Int. Cl.
*G01P 15/00* (2006.01)
*G01P 15/08* (2006.01)

(52) U.S. Cl. ............................. 73/514.16; 73/514.36; 73/514.29

(58) Field of Classification Search .............. 73/514.16, 73/514.29, 514.32, 514.36, 504.12, 504.15
See application file for complete search history.

(56) References Cited

U.S. PATENT DOCUMENTS

| 4,653,326 | A |   | 3/1987  | Danel et al. ............... 73/517 R |
| 4,855,544 | A | * | 8/1989  | Glenn ................. 200/61.45 R |
| 5,016,072 | A |   | 5/1991  | Greiff .......................... 357/26 |
| 5,129,983 | A |   | 7/1992  | Freiff ......................... 156/628 |
| 5,316,979 | A |   | 5/1994  | MacDonald et al. ........ 437/203 |
| 5,465,604 | A |   | 11/1995 | Sherman .................. 731/1 DV |
| 5,496,436 | A |   | 3/1996  | Bernstein et al. ......... 156/628.1 |
| 5,503,017 | A |   | 4/1996  | Mizukoshi ............... 73/514.36 |
| 5,610,335 | A |   | 3/1997  | Shaw et al. ............. 73/514.36 |
| 5,610,337 | A |   | 3/1997  | Nelson .......................... 73/651 |
| 5,707,077 | A | * | 1/1998  | Yokota et al. ............... 280/735 |
| 5,846,849 | A |   | 12/1998 | Shaw et al. ................... 438/52 |
| 5,847,454 | A |   | 12/1998 | Shaw et al. ................. 257/734 |
| 5,917,226 | A |   | 6/1999  | Chan et al. ................. 257/415 |
| 6,008,138 | A |   | 12/1999 | Laermer et al. ............ 438/725 |
| 6,028,343 | A |   | 2/2000  | Chan et al. ................. 257/417 |
| 6,058,778 | A |   | 5/2000  | Chan et al. ............. 73/514.16 |
| 6,124,765 | A |   | 9/2000  | Chan et al. ............. 331/116 M |
| 6,171,879 | B1 |  | 1/2001  | Chan et al. ................... 438/52 |
| 6,180,536 | B1 |  | 1/2001  | Chong et al. |
| 6,218,209 | B1 |  | 4/2001  | Chan et al. ................... 438/52 |
| 6,235,550 | B1 |  | 5/2001  | Chan et al. ................... 438/52 |
| 6,278,337 | B1 |  | 8/2001  | Chan et al. ............. 331/116 M |
| 6,316,796 | B1 |  | 11/2001 | Petersen et al. ............ 257/254 |
| 6,389,899 | B1 | * | 5/2002  | Partridge et al. ........ 73/514.33 |
| 6,410,361 | B2 |  | 6/2002  | Dhuler et al. |
| 2003/0209075 | A1 | | 11/2003 | Okada ..................... 73/514.16 |

FOREIGN PATENT DOCUMENTS

EP    0 937 985 A1    8/1999
WO    WO 02/41006 A2    5/2002

* cited by examiner

*Primary Examiner*—Helen C. Kwok
(74) *Attorney, Agent, or Firm*—David V. Carlson; Lisa K. Jorgenson

(57) ABSTRACT

A released-beam sensor includes a semiconductor substrate having a layer formed thereon, and an aperture formed in the layer. A beam is mechanically coupled at a first end to the layer and suspended above the layer such that a second end forms a cantilever above the aperture. A boss is coupled to a second end of the beam and suspended at least partially within the aperture. The beam is configured to flex in response to acceleration of the substrate along a vector substantially perpendicular to a surface of the substrate. Parameters of the sensor, such as the dimensions of the beam, the mass of the boss, and the distance between the boss and a contact surface within the aperture, are selected to establish an acceleration threshold at which the boss will make contact with the contact surface. The sensor may be employed to deploy an airbag in a vehicle.

20 Claims, 4 Drawing Sheets

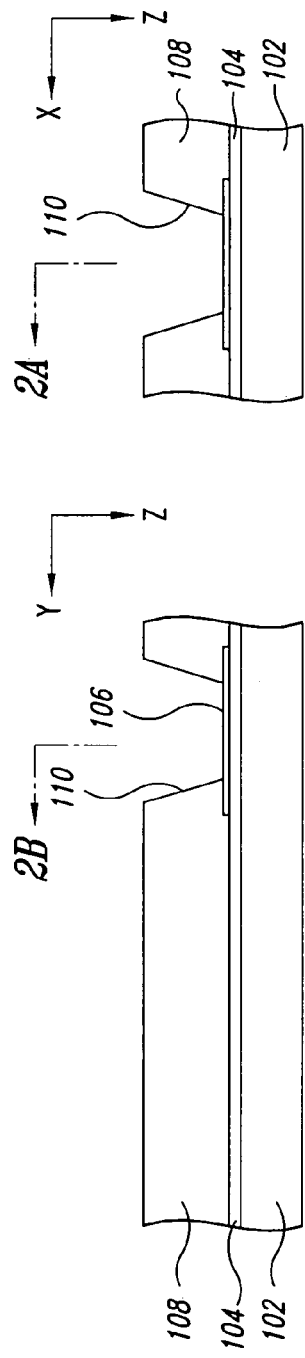
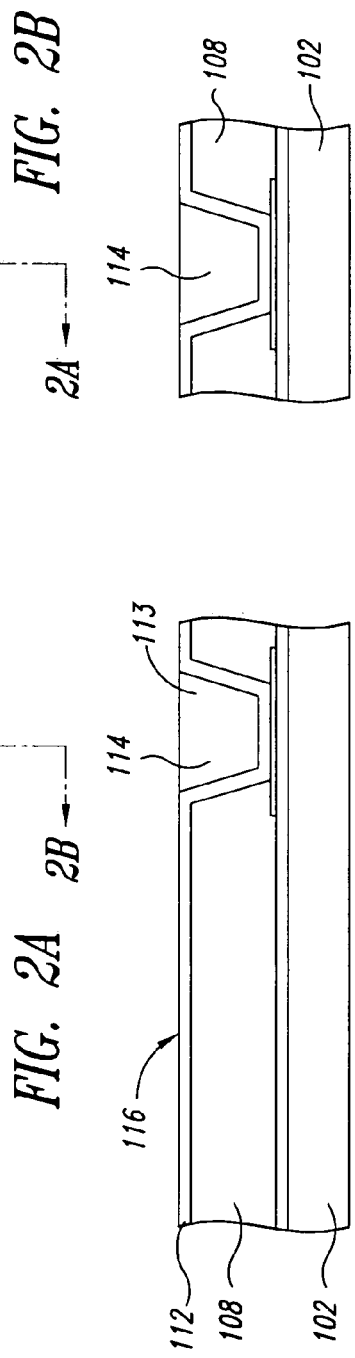
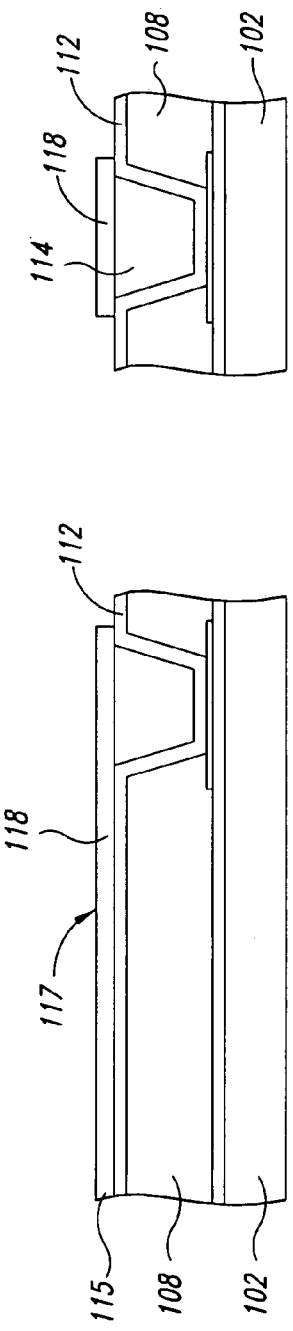

WEIGHTED RELEASED-BEAM SENSOR

BACKGROUND OF THE INVENTION

1. Field of the Invention

The present disclosure relates generally to a semiconductor released-beam device, and in particular, relates to a semiconductor released-beam device having a weighted beam.

2. Description of the Related Art

Micro-electromechanical systems (MEMS) in semiconductors have arisen for various applications to sense temperature, pressure, strain, acceleration, rotation, chemical properties of liquids and gases, etc. Those MEMS structures are usually combined with other integrated circuits, such as metal oxide semiconductor (MOS) circuits or complimentary metal oxide semiconductor (CMOS) circuits, for analyzing and calculating the parameters sensed by MEMS. Therefore, the MEMS manufacturing processes are required to be compatible with the existing MOS or CMOS manufacturing processes such that the whole system is inexpensive, reliable, and compact.

Different MEMS structures in semiconductors have been proposed and developed for such various sensing purposes. For example, a released-beam sensor was proposed in U.S. Pat. No. 5,917,226 for detecting temperature variation and an integrated released-beam oscillator was proposed in U.S. Pat. No. 6,278,337. A similar released-beam sensor was also proposed in U.S. Pat. No. 6,218,209 ('209 patent) for detecting acceleration and could be applied in airbag, antilock braking, or ride suspension systems for automobiles or in-flight aircraft monitoring systems.

BRIEF SUMMARY OF THE INVENTION

According to an embodiment of the invention, a released-beam sensor has a semiconductor material substrate having a layer positioned thereon, and an aperture in the layer. A beam is mechanically coupled at a first end to the layer and suspended above the layer such that the second end forms a cantilever above the aperture. A boss of semiconductor material is coupled to the second end of the beam and suspended at least partially within the aperture.

The beam is configured to flex in response to acceleration of the substrate along a vector substantially perpendicular to a surface of the substrate. Parameters of the sensor, such as the dimensions of the beam, the mass of the boss, and the distance between the boss and a contact surface, are selected to establish an acceleration threshold at which the boss will make contact with a conductive surface within the aperture.

Methods of manufacture and use are as described, according to embodiments of the invention.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale.

FIGS. 2A-5B illustrate various steps in the manufacture of a released-beam sensor, according to an embodiment of the invention, with all Figures A showing a side sectional view taken along lines A-A of FIG. 1, and all Figures B showing an end sectional view taken along lines B-B of FIG. 1.

DETAILED DESCRIPTION OF THE INVENTION

In the following description, certain specific details are set forth in order to provide a thorough understanding of various embodiments of the invention. However, one skilled in the art will understand that the invention may be practiced without these details.

Figure 1:
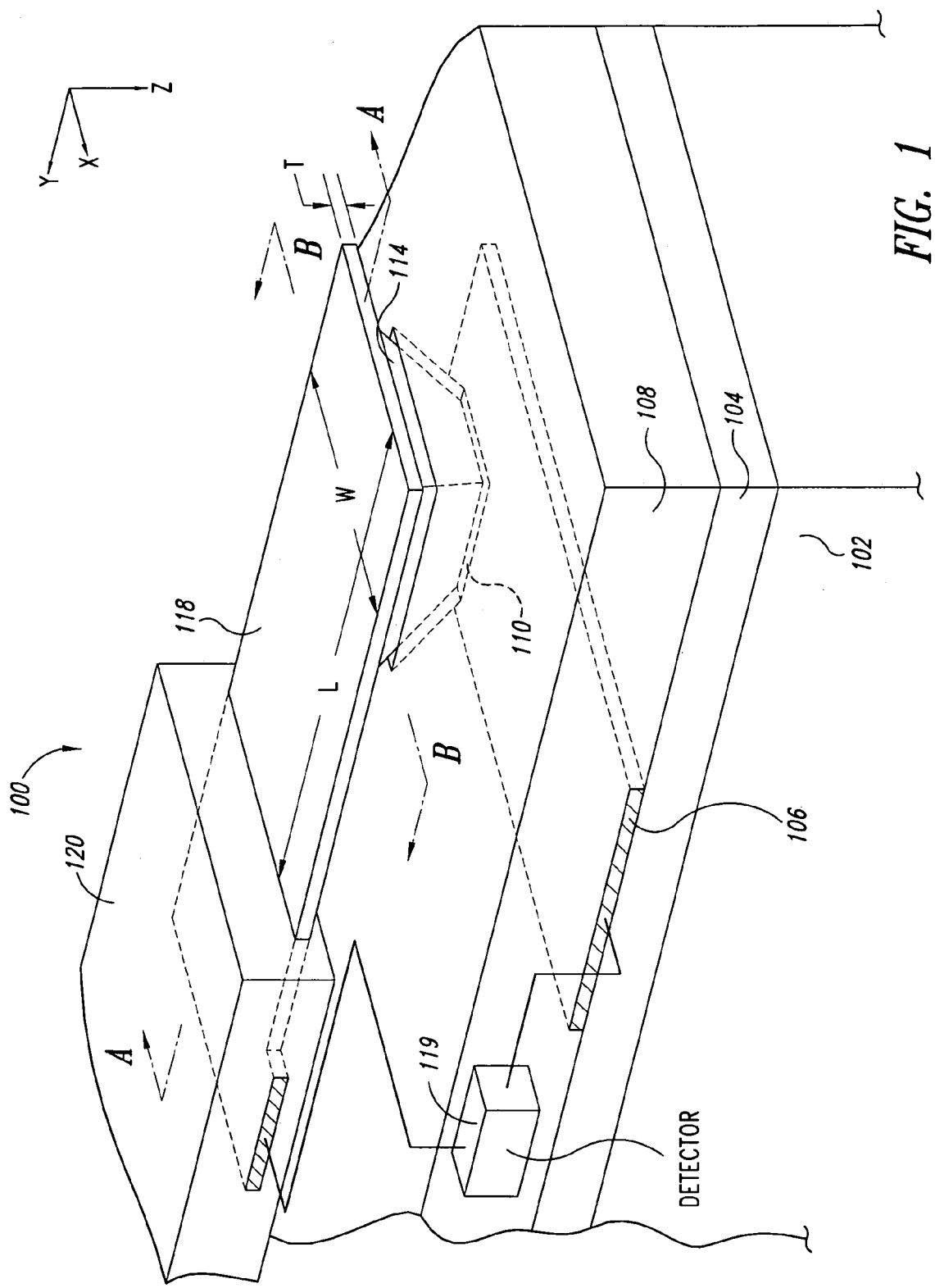
FIG. 1 is an isometric view of a released-beam sensor, according to an embodiment of the invention.

FIG. 1 illustrates a released-beam sensor 100 according to a first embodiment of the invention. A portion of a semiconductor material substrate 102 is shown with layers 104 and 108 positioned thereon. A conductive layer 106 is positioned between the layers 104 and 108.

The sensor 100 includes a beam 118 anchored at one end, such that the beam forms a cantilever lying in a plane substantially parallel to a surface of layer 108. A second end of the beam ~118 extends above a cavity or aperture 110 formed in the layer 108. A knob or boss 114 of semiconductor material is coupled to the second end of the beam 118 and positioned to be suspended by the beam 118 within the aperture 110. The conductive layer 106 is positioned underneath the layer 108 such that a portion thereof is exposed within the aperture 110.

The beam 118 and boss 114 are made of any acceptable material that includes a conductive layer. According to one embodiment, the beam and boss are conductive and formed of a metal or semiconductor layer. In other embodiments, the beam and boss are glass, undoped silicon, or other dielectric, with a conductive layer coupled thereto to provide an electrical connection from the boss to the first end of the beam 118. Alternatively, the beam 118 may be formed of a material that is different from the material used to form the boss 114.

Dimensions of the beam 118, such as its length L, width W, and thickness T, are selected according to the requirements of the particular application. In the embodiment of FIG. 1, it may seen that the width of the beam 118 is significantly greater than the thickness thereof. Accordingly, the beam 118 will be relatively susceptible to flexing in the z-axis, while resisting flexing in the x-axis. Accordingly, a sensor incorporating the beam 118 will be responsive to acceleration in the z-axis while being substantially insensitive to accelerations in the x- or y-axis. The degree of sensitivity in the z-axis is influenced by factors such as the dimensions of the beam 118, particularly the length and thickness, and the weight of the boss 114. Thus, by controlling these factors, the degree of sensitivity of the beam 118 may be selected.

In a typical application, the materials of the boss 114 and the beam 118 are electrically conductive, and are electrically coupled to a detector circuit. The conductive layer 106 is also electrically coupled to the detector circuit 119. The detector circuit 119 is configured to detect electrical contact between the boss 114 and the conductive layer 106. Thus, if the semiconductor substrate 102 on which the sensor 100 is formed is subjected to an acceleration in the z-axis of sufficient magnitude, the beam 118 flexes downward until the boss 114 makes contact with the conductive layer 106, closing an electrical circuit, which is detected by the detector circuit 119.

The detector circuit 119 is shown only diagrammatically in FIG. 1, and will not be described in detail, inasmuch as the design and manufacture of such circuits is well known in the art today and within the abilities of one of ordinary skill in the art. The detector circuit 119 may be formed on the substrate 102, or may be formed on another substrate, or otherwise located external to the substrate 102 and sensor 100, and connected thereto by conventional means.

Sensors of the type described with reference to FIG. 1 may be used in applications where single-axis sensitivity is desirable. For example, it may be important that a sensor configured to deploy a vehicle airbag in response to a collision do so only when the collision occurs along the axis for which that airbag is configured to provide protection. Thus, in the case of a sensor configured to deploy a forward airbag of a vehicle, the sensor 100 would be mounted in the vehicle such that its z-axis is aligned with the direction of travel of the vehicle. In the event of a collision, the substrate 102 will decelerate at the same rate as the rest of the vehicle. Meanwhile, the boss 114 will tend to continue traveling along the z-axis, causing the beam 118 to flex downward, as viewed in FIG. 1. If the degree of deceleration is high enough to cause the boss 114 to come into contact with a contact surface, such as the conductive layer 106, the detection circuit will instantly trigger deployment of the airbag.

On the other hand, if the vehicle is subjected to a collision from a side thereof, the sensor 100 will be insensitive to such a collision, and will not trigger the forward airbags. If the vehicle is equipped with side airbags, a separate sensor, configured to detect such side collisions, will deploy the airbags of the appropriate side in a manner similar to that described above.

The term acceleration, as used in this specification is considered to encompass the term deceleration, which, as is known in the art, merely refers to an acceleration having a negative value. Configuring a sensor such as the sensor 100 of FIG. 1 to respond to an acceleration having either a negative or a positive value is a simple matter of selecting the orientation of the sensor with respect to the direction of travel.

As has been explained, the sensitivity of the sensor 100 may be selected by controlling such parameters as the dimensions of the beam 118, the mass of the boss 114, and the degree of separation of the boss 114 from the conductive layer 106. All these parameters are determined prior to the manufacture of the sensor 100, and are within the skill of one of ordinary skill in the art. For the following discussion, the sensitivity thus selected will be referred to as the sensor's inherent sensitivity.

It is known that an automobile may be subjected to collisions along any vector that lies approximately in a horizontal plane, with respect to the automobile. Automobiles are not normally subjected to collisions or other significant acceleration forces along vectors not lying in the horizontal plane. This fact can be exploited to provide additional selectivity to the sensitivity of the sensor 100, as described herein.

According to an embodiment of the invention, the sensor 100 is configured to have a relatively low acceleration threshold. When mounted to a vehicle, the sensor 100 may be aligned such that its Z axis, as seen in FIG. 1, lies directly in the vector for which the corresponding airbag is configured to provide protection. This configuration provides a minimum acceleration threshold, or, in other words, a maximum sensitivity along that vector. However, if the sensor is mounted such that its Z axis lies at an angle with respect to the horizontal plane, its sensitivity will be reduced in direct relation to the degree of the angle, without increasing its sensitivity to acceleration in other vectors lying in the horizontal plane. In this way, the sensitivity is selectable from 100% of its inherent sensitivity, when the sensor is mounted with its Z axis lying directly in the horizontal plane, to substantially 0% of its inherent sensitivity, when the sensor is mounted with its Z axis lying perpendicular to the horizontal plane. In this way, sensors having substantially identical inherent sensitivities can be employed in applications requiring a variety of different acceleration thresholds.

Manufacture of the sensor 100 will now be described with reference to FIGS. 2A-5B. In each of FIGS. 2A-5B cross-sections A and B are provided, with sections A showing a view along lines A-A, and sections B showing a view along lines B-B, as seen in FIG. 1. Many of the process steps are not shown or discussed in detail, inasmuch they are well known in the art and will be clear to one having ordinary skill in the art, given the present description.

Referring first to FIGS. 2A and 2B, a first layer 104 is formed on an upper surface of the semiconductor material substrate 102. Conductive layer 106 is then formed, and patterned as necessary, over the first layer 104. A second layer 108 is then formed over the conductive layer 106 and first layer 104. An aperture 110 is formed in the second layer 108 such that a portion of the conductive layer 106 is exposed at the bottom of the aperture 110. The material of the conductive layer 106 and the formulation of the etching step employed to form the aperture 110 are selected such that the conductive layer 106 acts as an etch stop in the formation of the aperture 110.

The first and second layers 104, 108 may be made of any suitable material or combination of materials. Appropriate materials may include doped or undoped silicon, any of various oxides, quartz, glass, or any other material having the necessary characteristics, as described herein. The first layer may be an undoped epitaxial silicon isolation layer, with the second layer being a doped epitaxial layer suitable for the formation of active components elsewhere in the layer. According to an embodiment, the first layer is omitted, and the second layer is formed directly on the semiconductor material substrate 102. In another embodiment, the conductive 106 layer is also omitted, and a highly doped conductive region is formed in the substrate 102, positioned directly beneath the aperture 110 as a contact surface. In the embodiment of FIGS. 2A-8B, the layers 104 and 108 are nonconductive, at least in the portions shown in the figures.

Referring now to FIGS. 3A and 3B, a sacrificial layer 112 is then formed over the second layer 108 and within the aperture 110 to a selected thickness. A layer 113 is then formed over the surface of the sacrificial layer 112 to a thickness sufficient to completely fill the aperture 110, then planarized back until the upper surface of the sacrificial layer 112 is exposed, leaving a mass of material within the aperture, and a planarized surface 116 over the sacrificial layer 112. The portion of the layer 113 remaining after the planarization forms the boss 114 and may be conductive itself or have a conductive layer applied thereto.

Referring now to FIGS. 4A and 4B, a conductive layer 115 is formed and patterned over the sacrificial layer and the boss 114 to form the beam 118 of the sensor 100.

Figure 5B:
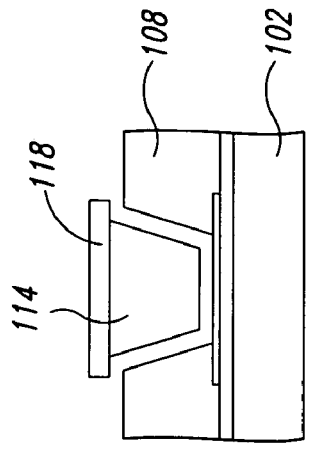
Figure 5A:
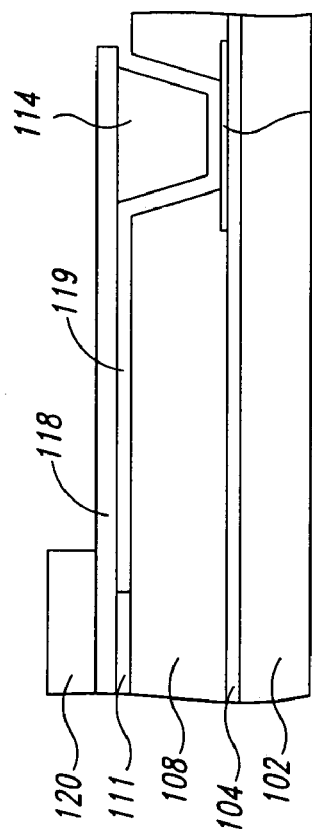

As shown in FIG. 5A, a third dielectric layer 120 is formed over the sacrificial layer 112 and the beam 118, and then patterned to expose a portion of the beam 118. An isotropic etch is then performed, configured to remove the sacrificial layer 112, except where protected by the dielectric layer 120. A portion 111 of the sacrificial layer 112 remains under a first end of the beam 118 as a support, while under a second end, all the sacrificial layer 112 is removed. In this way, the beam 118 is released, and in condition for operation as a released-beam sensor.

According to another embodiment of the invention, the layer 113 is planarized to a thickness of the beam 118, indicated at surface 117. The layer 113 is then patterned to form the beam 118. In this way, the boss 114 and the beam 118 are formed in a common step and are a unitary, integral member.

Released-beam sensors configured according to the principles of the present invention have several advantages over previously known sensors. For example, many previously known released-beam sensors are formed in a semiconductor material such as the second layer 108, and occupy the entire thickness of the layer. In contrast, the released-beam sensor 100 is formed above the second layer 108. Accordingly, other devices or structures may be formed in the layer 108 underneath the released beam, thereby utilizing space that was heretofore unavailable. Another advantage is provided by the fact that the sensor 100 includes the boss 114 coupled to the beam 118. The additional mass of the boss 114 affixed thereto will cause the beam 118 to flex to a greater degree than the beam alone, under an equal degree of acceleration, and thus increase the sensitivity of the sensor.

Accordingly, for a given threshold of sensitivity, the beam 118 may be shorter than would be otherwise necessary without the boss 114 affixed thereto. Thus, less area of the semiconductor substrate is occupied by the sensor 100. An additional advantage that the released-beam sensor 100 has over many inertial sensors is that the circuitry required for its use as an acceleration threshold sensor can be extremely simple, since all that is necessary is the detection of a closed circuit between the boss 114 and the conductive layer 106. In contrast, sensors that employ capacitive coupling devices require relatively complex circuitry to detect changes in capacitance, and the provision of reference values for comparison with a change in capacitive coupling caused by acceleration, to determine whether an acceleration threshold has been exceeded.

Figure 6B:
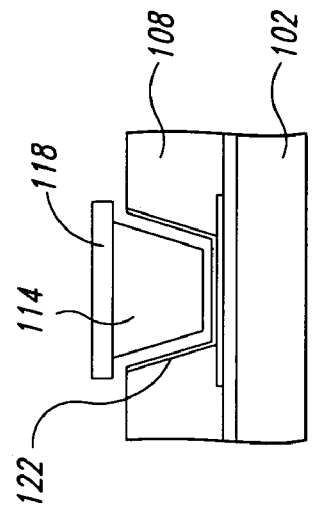
FIG. 6B is an end sectional view of the embodiment of FIG. 6A.
Figure 6A:
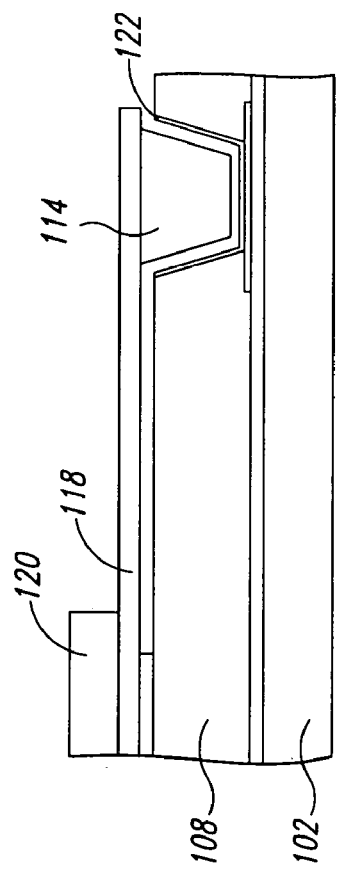
FIG. 6A is a side sectional view of another embodiment of the invention.

Referring now to FIG. 6, another embodiment of the invention is illustrated. According to the embodiment of FIG. 6, an additional conductive layer 122 is deposited prior to the formation of the sacrificial layer 112 described with reference to FIGS. 3A and B. The conductive layer 122 is deposited and patterned within the aperture 110 such that, when the beam 118 flexes downward, the boss 114 makes electrical contact, not only with a lower surface of the aperture 110, but also around the sidewalls of the aperture 110. In this way, contact resistance between the boss 114 and the conductive layer 106 is reduced, for improved performance.

Figure 7B:
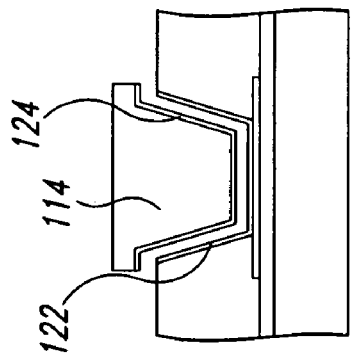
FIG. 7B is an end sectional view of the embodiment of FIG. 7A.
Figure 8B:
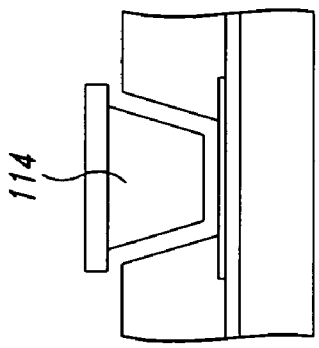
FIG. 8B is an end sectional view of the embodiment of FIG. 8A.
Figure 7A:
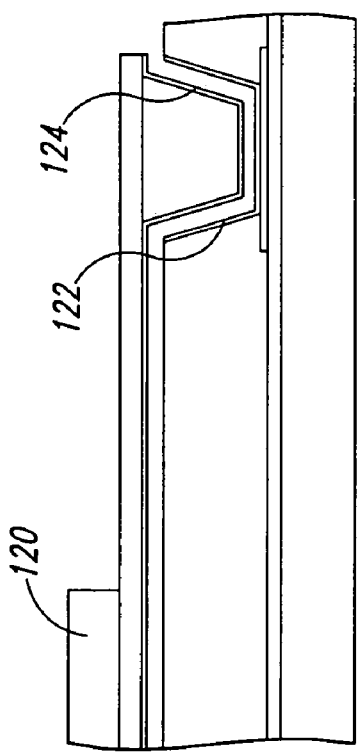
FIG. 7A is a side sectional view of additional embodiment of the invention.

FIG. 7 illustrates an embodiment in which a conductive layer 124 is deposited over the sacrificial layer 112 prior to the formation of the boss 114 or the beam 118. The conductive layer 124 is then patterned with the beam 118, and remains coupled to a lower surface of the beam 118 and boss 114 after the removal of the sacrificial layer 112. According to the embodiment of FIG. 7, the boss 114 and the beam 118 need not be formed of conductive material, inasmuch as the layer 124 provides a conductive path from the boss 114 to the detector circuit.

Figure 8A:
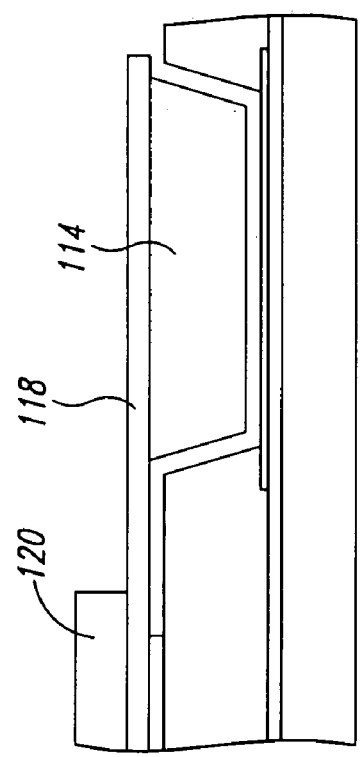
FIGS. 8A is a side sectional view of a further embodiment of the invention.

Referring now to FIG. 8, an embodiment of the invention is shown in which the boss 114 and aperture 110 are selected to have a longer dimension in the y-axis. Such a configuration provides more surface area, and therefore a lower contact resistance, between the boss 114 and the conductive layer 106. Additionally, the increased mass of the boss 114 of FIG. 8 further reduces the necessary length of the beam 118, for a given acceleration threshold.

According to an embodiment of the invention, layers 104 and 108, are epitaxial layers formed over the semiconductor substrate 102, and may be of doped or undoped silicon. Other semiconductor devices may be formed therein at different locations in the circuit and may be conductive at other locations using selective doping.

While the release beam sensor 100 has been described for use with an acceleration threshold sensor, in some applications, it may be desirable to detect capacitive coupling between the boss 114 and the conductive layer 106, in place of, or in addition to, the detection of electrical contact. For example, by measuring changes in capacitive coupling, a range of acceleration can be detected, rather than a threshold, only. It will be recognized that a capacitive coupling will exist between the boss 114 and the conductive layer 106. Accordingly, if the detector circuit is configured to detect changes in capacitive coupling, the sensor 100 may be employed to measure or detect varying changes in acceleration. Such detector circuits are known in the art, and within the abilities of one of ordinary skill in the art.

Released-beam sensors are described and claimed in U.S. application Ser. No. 10/721,524 and U.S. application Ser. No. 11/024,192, now issued as U.S. Pat. No. 7,179,674, which are incorporated herein by reference, in their entirety.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except by the appended claims.

The invention claimed is:

1. A sensor, comprising:
    a semiconductor substrate;
    a first layer formed on a surface of the substrate;
    an aperture within the first layer;
    a beam having first and second ends, the beam being mechanically coupled at the first end to the first layer and suspended above the first layer for at least a portion of the length thereof and the second end having a region above the aperture; and
    a boss coupled to the second end of the beam and suspended at least partially within the aperture.

2. The sensor of claim 1 wherein the first layer is a dielectric layer.

3. The sensor of claim 1, further comprising a second layer positioned between the first layer and the semiconductor substrate.

4. The sensor of claim 1, further comprising a conductive layer positioned between the semiconductor substrate and the first layer with a portion thereof exposed within the aperture.

5. The sensor of claim 1 wherein the beam and the boss are electrically conductive.

6. The sensor of claim 1, further comprising a conductive layer positioned on sidewalls of the aperture.

7. The sensor of claim 1, further comprising a conductive layer coupled to the boss between the boss and a sidewall of the aperture.

8. The sensor of claim 1, further comprising a contact surface within the aperture.

9. The sensor of claim 8, further comprising a circuit within the semiconductor substrate configured to detect electrical contact between the boss and the contact surface.

10. The sensor of claim 8, further comprising a circuit within the semiconductor substrate configured to detect changes in capacitive coupling between the boss and the contact surface.

11. The sensor of claim 1 wherein the beam is composed of a metal.

12. The sensor of claim 1 wherein the beam is composed of a semiconductor material.

13. The sensor of claim 1 wherein the boss is composed of a semiconductor material.

14. A sensor, comprising:
a semiconductor substrate;
a first layer of material formed on a surface of the substrate;
a beam having first and second ends, the beam being mechanically coupled at the first end to the first layer and suspended above the first layer such tat the second end forms a cantilever above the first layer;
means for increasing a sensitivity of the cantilever to acceleration in at least one axis, the increasing means includes an aperture formed in the first layer and a boss coupled to the second end of the beam and suspended at least partially within the aperture.

15. The sensor of claim 14, comprising:
means for reducing a contact resistance in a circuit that includes the beam, the boss, and a layer formed on the substrate.

16. A system, comprising:
a vehicle having a motor, a drive train coupled to the motor, an axle coupled to the drive train, and wheels coupled to the axle for causing movement of the vehicle powered by the motor;
a passenger seat within said vehicle;
an airbag positioned adjacent to the passenger seat; and
a sensor coupled to the airbag configured to cause inflation of the airbag, the sensor including a semiconductor material substrate, a first layer above the semiconductor substrate, a beam having first and second ends, the beam being mechanically coupled at the first end to the substrate and positioned above the first layer for a portion thereof to form a cantilever in a plane that is substantially parallel to an upper surface of the substrate, and a boss of semiconductor material coupled to the second end of the beam and suspended over the substrate;
wherein the semiconductor material substrate includes an aperture positioned underneath the beam such that at least a portion of the boss is suspended within the aperture by the beam.

17. The sensor of claim 1 wherein the beam is configured to move the boss along a selected vector relative to the aperture in response to an acceleration, and the beam is spaced apart in a direction along the selected vector from an upper surface of the first layer.

18. The sensor of claim 1 wherein an upper surface of the first layer is interposed between a bottom surface of at least a portion of the beam suspended above the first layer and the semiconductor substrate.

19. The sensor of claim 14 wherein an upper surface of the first layer is interposed between a bottom surface of at least a portion of the beam suspended above the first layer and the semiconductor substrate.

20. The system of claim 16 wherein an upper surface of the first layer is interposed between at least a portion of a bottom surface of the beam and the semiconductor substrate.

* * * * *